(12) United States Patent
Krasnov et al.

(10) Patent No.: US 8,415,194 B2
(45) Date of Patent: Apr. 9, 2013

(54) REAR ELECTRODE STRUCTURE FOR USE IN PHOTOVOLTAIC DEVICE SUCH AS CIGS/CIS PHOTOVOLTAIC DEVICE AND METHOD OF MAKING SAME

(75) Inventors: Alexey Krasnov, Canton, MI (US); Willem den Boer, Brighton, MI (US); Scott V. Thomsen, South Lyon, MI (US); Leonard L. Boyer, Jr., Flat Rock, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 87 days.

(21) Appl. No.: 12/926,943

(22) Filed: Dec. 20, 2010

(65) Prior Publication Data

US 2011/0097841 A1    Apr. 28, 2011

Related U.S. Application Data

(60) Division of application No. 12/149,919, filed on May 9, 2008, now Pat. No. 7,875,945, which is a continuation-in-part of application No. 11/892,161, filed on Aug. 20, 2007, and a continuation-in-part of application No. 11/808,764, filed on Jun. 12, 2007, now Pat. No. 7,846,750.

(51) Int. Cl.
    *H01L 21/00* (2006.01)
(52) U.S. Cl. ........ 438/69; 438/57; 438/59; 438/72; 257/414; 257/432; 257/436
(58) Field of Classification Search .......... 438/57, 438/59, 69, 72; 257/414, 432, 436
    See application file for complete search history.

(56) References Cited

U.S. PATENT DOCUMENTS 3,616,401 A * 10/1971 Cunningham et al. ... 204/192.25
3,655,544 A *  4/1972 Rairden, III ............ 204/192.15
5,101,260 A     3/1992 Nath et al.
(Continued)

FOREIGN PATENT DOCUMENTS

EP     1 691 421        8/2006
JP     2007-113033   *  5/2007

OTHER PUBLICATIONS

U.S. Appl. No. 12/149,919, filed May 9, 2008; Krasnov et al.
(Continued)

*Primary Examiner* — Jarrett Stark
*Assistant Examiner* — John M Parker
(74) *Attorney, Agent, or Firm* — Nixon & Vanderhye P.C.

(57) ABSTRACT

A photovoltaic device including a rear electrode which may also function as a rear reflector. In certain example embodiments of this invention, the rear electrode includes a metallic based reflective film that is oxidation graded, so as to be more oxided closer to a rear substrate (e.g., glass substrate) supporting the electrode than at a location further from the rear substrate. In other words, the rear electrode is oxidation graded so as to be less oxided closer to a semiconductor absorber of the photovoltaic device than at a location further from the semiconductor absorber in certain example embodiments. In certain example embodiments, the interior surface of the rear substrate may optionally be textured so that the rear electrode deposited thereon is also textured so as to provide desirable electrical and reflective characteristics. In certain example embodiments, the rear electrode may be of or include Mo and/or $MoO_x$, and may be sputter-deposited using a combination of $MoO_x$ and Mo sputtering targets.

30 Claims, 10 Drawing Sheets

U.S. PATENT DOCUMENTS

| | | | |
|---|---|---|---|
| 5,296,045 | A | 3/1994 | Banerjee et al. |
| 5,569,332 | A | 10/1996 | Glatfelter et al. |
| 5,620,530 | A | 4/1997 | Nakayama |
| 6,072,117 | A | 6/2000 | Matsuyama et al. |
| 6,123,824 | A | 9/2000 | Sano et al. |
| 6,288,325 | B1 | 9/2001 | Jansen et al. |
| 6,440,278 | B1 | 8/2002 | Kida et al. |
| 6,613,603 | B1 | 9/2003 | Sano |
| 6,784,361 | B2 | 8/2004 | Carlson et al. |
| 6,878,403 | B2 | 4/2005 | Veerasamy et al. |
| 6,951,689 | B1 | 10/2005 | Higashikawa |
| 7,049,003 | B2 | 5/2006 | Thomsen et al. |
| 7,846,750 | B2 | 12/2010 | Boyer, Jr. |
| 7,875,945 | B2 | 1/2011 | Krasnov et al. |
| 2004/0261841 | A1 | 12/2004 | Negami et al. |
| 2005/0215079 | A1 | 9/2005 | Taunier et al. |
| 2006/0180200 | A1 | 8/2006 | Platzer Bjorkman et al. |
| 2007/0000537 | A1* | 1/2007 | Leidholm et al. ............ 136/252 |
| 2007/0044834 | A1 | 3/2007 | Berke et al. |

OTHER PUBLICATIONS

"A Comprehensive Characterization of the Interfaces in Mo/CIS/CdS/ZnO Solar Cell Structures", Schmid et al., Solar Energy Materials and Solar Cells 41/42 (1996) pp. 281-294.

U.S. Appl. No. 11/892,161, filed Aug. 20, 2007 (Lu et al.).

"A Comprehensive Characterization of the Interfaces in Mo/CIS/CdS/ZnO Solar Cell Structures", Schmid et al., 1994 IEEE, Dec. 5-9, pp. 198-201.

"Molybdenum as a Gate Electrode for Deep Sub-Micron CMOS Technology", Ranade et al., Mat. Res. Soc. Symp. vol. 611, pp. C3.2.1-C3.2.6.

"Photoelectric Work Function of a Molybdenum Single Crystal for the (100), (110), (111), (112), (114) and (332) Faces", Berge et al., Surface Science 43 (1974) pp. 275-292.

"Impact of Oxygen on the Work Functions of Mo in Vacuum and on $ZrO_2$", Knizhnik et al., Journal of Applied Physics 97, (2005).

* cited by examiner

REAR ELECTRODE STRUCTURE FOR USE IN PHOTOVOLTAIC DEVICE SUCH AS CIGS/CIS PHOTOVOLTAIC DEVICE AND METHOD OF MAKING SAME

This application is a divisional of application Ser. No. 12/149,919, filed May 9, 2008, now U.S. Pat. No. 7,875,945 which is a continuation-in-part (CIP) of Ser. Nos. 11/892,161 filed Aug. 20, 2007 and 11/808,764 filed Jun. 12, 2007 (now U.S. Pat. No. 7,846,750), the entire disclosures of which are all hereby incorporated herein by reference in this application.

This invention relates to a rear electrode for use in a photovoltaic device or the like, and methods of making the same. The rear (or back) electrode may also function as a rear (or back) reflector in certain example instances. In certain example embodiments of this invention, the rear electrode comprises a metallic based reflective film that is oxidation graded, so as to be more oxided closer to a rear substrate (e.g., glass substrate) supporting the electrode than at a location further from the rear substrate. In other words, the rear electrode is oxidation graded so as to be less oxided closer to a semiconductor absorber of the photovoltaic device than at a location further from the semiconductor absorber. In certain example embodiments, there is provided a method of making the rear electrode for CIS and/or CIGS photovoltaic (e.g., solar cell) devices using magnetron sputter-deposition of molybdenum (Mo) in a multi-layer configuration. In certain example embodiments, nitrogen and/or hydrogen gases are used as additives to the sputtering gas (e.g., argon) to reduce stress of the coating, enhance its resistance to the selenization during the downstream device processing, and promote beneficial sodium migration from the soda-lime rear glass substrate to the semiconductor film of the device.

BACKGROUND AND SUMMARY OF EXAMPLE EMBODIMENTS OF INVENTION

Photovoltaic devices are known in the art (e.g., see U.S. Patent Document Nos. 2004/0261841, 2006/0180200, U.S. Pat. Nos. 6,784,361, 6,288,325, 6,613,603, and 6,123,824, the disclosures of which are hereby incorporated herein by reference). Examples of photovoltaic devices include CIGS $(Cu(In, Ga)(Se, S)_2)$, CIS $(CuInSe_2)$, and a-Si (amorphous silicon) solar cells. The CIGS and CIS films are conductive semiconductor compounds, and these stoichiometries are approximations.

Generally speaking, CIGS and CIS type photovoltaic devices include, from the front or light incident side moving rearwardly, a front substrate of a material such as glass, a front electrode comprising a transparent conductive layer such as a TCO (transparent conductive oxide), a light absorption semiconductor film (e.g., CIGS and/or CIS film), a rear electrode, and a rear substrate of a material such as glass. Sometimes an adhesive is provided between the front substrate and the front electrode, and it is also possible for window layer(s) (e.g., of or including CdS, ZnO, or the like) to be provided. Photovoltaic power is generated when light incident from the front side of the device passes through the front electrode and is absorbed by the light absorption semiconductor film as is known in the art.

A metal such as Mo (molybdenum) may be used as the rear electrode (bottom contact) of a photovoltaic device, such as a CIS solar cell. In certain instances, the Mo may be sputter-deposited onto a soda or soda-lime-silica rear glass substrate of the photovoltaic device. However, Mo rear electrodes suffer from the problem of delamination from the rear substrate.

Rear electrodes (e.g., Mo rear electrodes) preferably have low stress, high conductivity, and good adhesion to the rear substrate (e.g., glass substrate). In order to provide this combination of features, oxygen is introduced into the Mo rear electrode at the initial stage of deposition of the rear electrode on the substrate or otherwise in certain example embodiments of this invention. The application of the oxygen to the Mo rear electrode reduces the overall stress of the rear electrode and at the same time promotes adhesion of the rear electrode to the glass soda or soda lime silica glass substrate.

In certain example embodiments of this invention, there is provided a method of making the rear electrode for CIS and/or CIGS photovoltaic (e.g., solar cell) devices using magnetron sputter-deposition of molybdenum (Mo) in a multi-layer configuration. In certain example embodiments, nitrogen and/or hydrogen (e.g., $H_2$) gas(es) are used as additives to the sputtering gas (e.g., argon) to reduce stress of the coating, enhance its resistance to the selenization during the downstream device processing, and promote beneficial sodium migration from the soda-lime rear glass substrate to the semiconductor film of the device.

In certain example embodiments, there is provided a method of making a rear electrode structure for a photovoltaic device, the method comprising: providing a glass substrate; depositing a conductive electrode comprising Mo (molybdenum) on the glass substrate; and wherein said depositing the conductive electrode comprising Mo (molybdenum) comprises sputtering at least one target comprising Mo (metallic Mo or a MoOx ceramic in example embodiments) in an atmosphere including (i) an inert gas such as argon or the like, and (ii) from about 0.1 to 10% nitrogen and/or hydrogen gas.

In certain example embodiments of this invention, there is provided a method of making a rear electrode structure for a photovoltaic device, the method comprising: providing a glass substrate; depositing a conductive electrode comprising Mo (molybdenum) on the glass substrate; and wherein said depositing the conductive electrode comprising Mo (molybdenum) comprises sputtering at least one ceramic target comprising $MoO_x$ and at least one metallic target comprising Mo in depositing the conductive electrode.

In certain example embodiments of this invention, there is provided a method of making a rear electrode structure for a photovoltaic device, the method comprising: providing a substrate (glass or any other suitable material); depositing a conductive electrode comprising a metal (M) on the substrate; and wherein said depositing the conductive electrode comprises sputtering at least one ceramic target comprising $MO_x$ and at least one metallic target comprising M in depositing the conductive electrode. The metal M may be Mo or any other suitable metal.

In other example embodiments of this invention, there is provided a method of making a rear electrode structure for a photovoltaic device, the method comprising: providing a glass substrate; depositing a conductive electrode comprising Mo (molybdenum) on the glass substrate; and wherein said depositing the conductive electrode comprising Mo (molybdenum) comprises sputtering at least one ceramic target comprising $MoO_x$, where x is less than or equal to 0.1.

In other example embodiments of this invention, there is provided a photovoltaic device comprising: a front substrate; a front substantially transparent conductive electrode; an absorber semiconductor film; a conductive and reflective rear electrode; a rear glass substrate that supports at least the rear electrode; and wherein the rear electrode comprises a first layer or layer portion comprising an oxide of Mo and a second conductive layer or layer portion comprising substantially metallic Mo provided on the rear glass substrate over at least the first layer, so that the first layer or layer portion comprising the oxide of Mo is located between the rear glass substrate and the second layer or layer portion comprising substantially metallic Mo.

In certain example embodiments, the rear electrode is formed in a manner so that its major surface to be closest to the light absorption semiconductor film of the photovoltaic device is textured (roughened) in a substantially controlled and desired manner. In certain example embodiments, the interior surface of the rear glass substrate is textured (roughened) via acid etching, ion beam treatment, or the like. Then, the Mo inclusive rear electrode is formed on the textured surface of the rear glass substrate in a manner so that the major surface of the rear electrode to be closest to the light absorption semiconductor film is also textured. In certain example embodiments, the textured major surface of the rear electrode to be closest to the light absorption semiconductor film may be substantially conformal to the textured surface of the rear glass substrate.

The embodiments where the rear substrate is textured may or may not be used in combination with the embodiments where the rear electrode is oxidation graded, in different example embodiments of this invention.

The textured interior surface of the rear electrode is advantageous in several example respects. The textured surface of the rear electrode improves adhesion between the rear electrode and the semiconductor film. Moreover, the textured surface of the rear electrode allows the rear electrode to act as a scattering back electrode thereby permitting it to reflect incident light more effectively and efficiently into the light absorption semiconductor film. This can allow one of both of: improved efficiency of the photovoltaic device, and/or reduced thickness of the light absorption semiconductor film without sacrificing solar efficiency. In certain example embodiments, after the rear electrode has been formed on the rear glass substrate, the major surface of the rear electrode to be closest to the light absorption semiconductor film may be textured via one or more of ion beam treatment, plasma exposure, and/or a wet chemical etch such as HCl, nitric acid, acetic acid or a combination thereof. This post-deposition texturing (roughening) of the rear electrode surface may, or may not, be used in combination with embodiments where the rear glass substrate is textured. Thus, when the rear electrode is textured (roughened) after the deposition thereof, the rear glass substrate may or may not be textured. The textured rear glass substrate and/or textured rear electrode (which also functions as a reflector) may be used in a photovoltaic device (e.g., CIS or CIGS solar cell) where an active semiconductor film is provided between the rear electrode/reflector and a front electrode(s).

DETAILED DESCRIPTION OF EXAMPLE EMBODIMENTS OF THE INVENTION

Figure 1A:
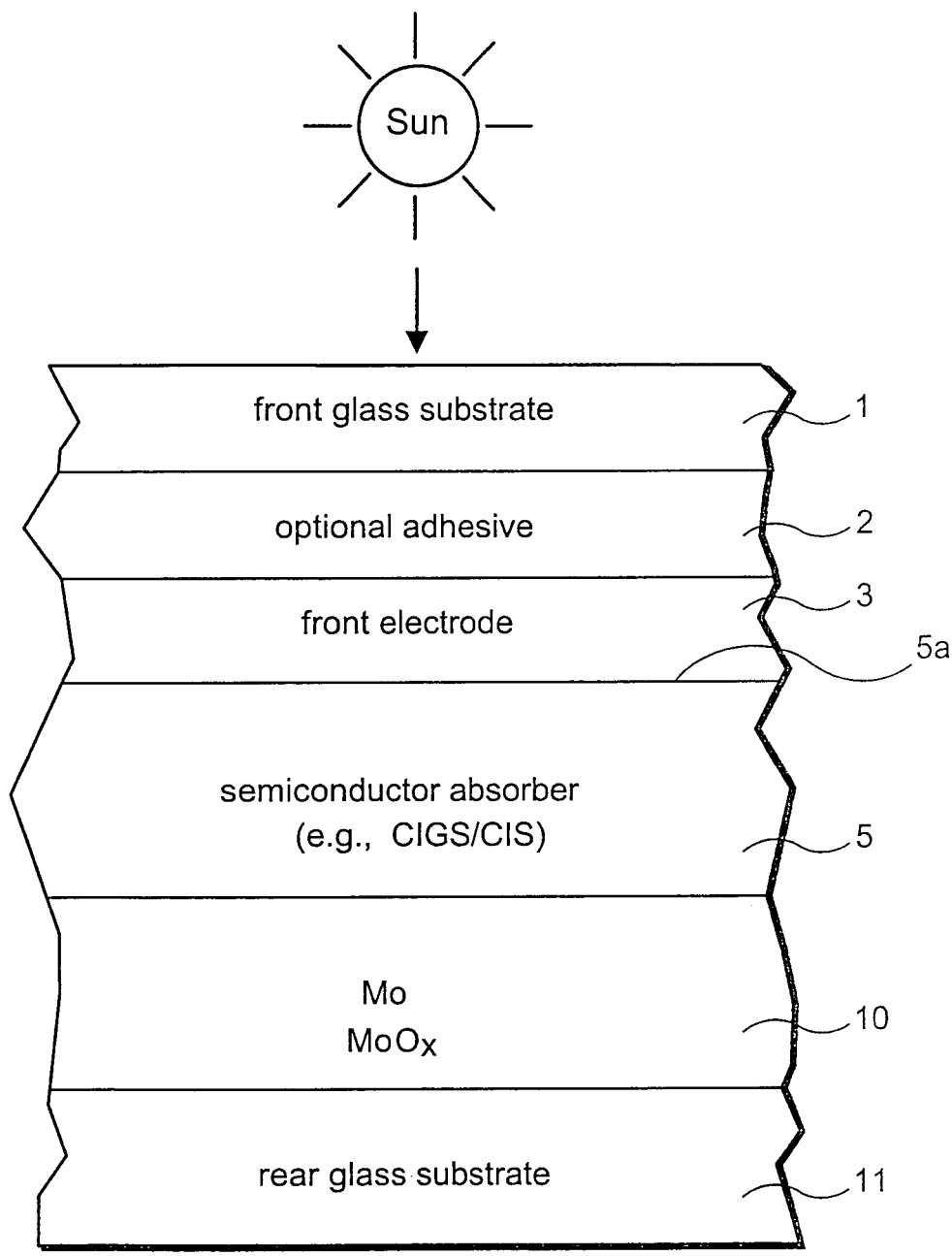
FIGS. 1(a) and 1(b) are cross sectionals view of example photovoltaic devices according to example embodiments of this invention.

Referring now more particularly to the figures in which like reference numerals refer to like parts/layers in the several views.

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si, CIS, CIGS or the like, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as light continues to generate electron-hole pairs in the photovoltaic device.

In certain example embodiments, single junction amorphous silicon (a-Si) photovoltaic devices include three semiconductor layers. In particular, the semiconductor film includes a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. In certain other example embodiments of this invention, the absorption semiconductor film may be of or include CIGS (approximately $Cu(In, Ga)(Se, S)_2$) and/or CIS (approximately $CuInSe_2$). However, it is noted that while certain example embodiments of this invention are directed toward CIGS, CIS and/or amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe photovoltaic devices, polysilicon and/or microcrystalline Si photovoltaic devices, and the like.

In certain example embodiments of this invention, there is provided a method of making the rear opaque electrode for CIS and/or CIGS photovoltaic (e.g., solar cell) devices using magnetron sputter-deposition of molybdenum (Mo) in a multi-layer configuration. In certain example embodiments, nitrogen and/or hydrogen gases are used as additives to the sputtering gas (e.g., argon) to reduce stress of the coating, enhance its resistance to the selenization during the downstream device processing, and promote beneficial sodium migration from the soda-lime rear glass substrate to the semiconductor film of the device. Moreover, oxygen may be introduced at least in an area close to the rear glass substrate for improvement of durability and the like.

Figure 1B:
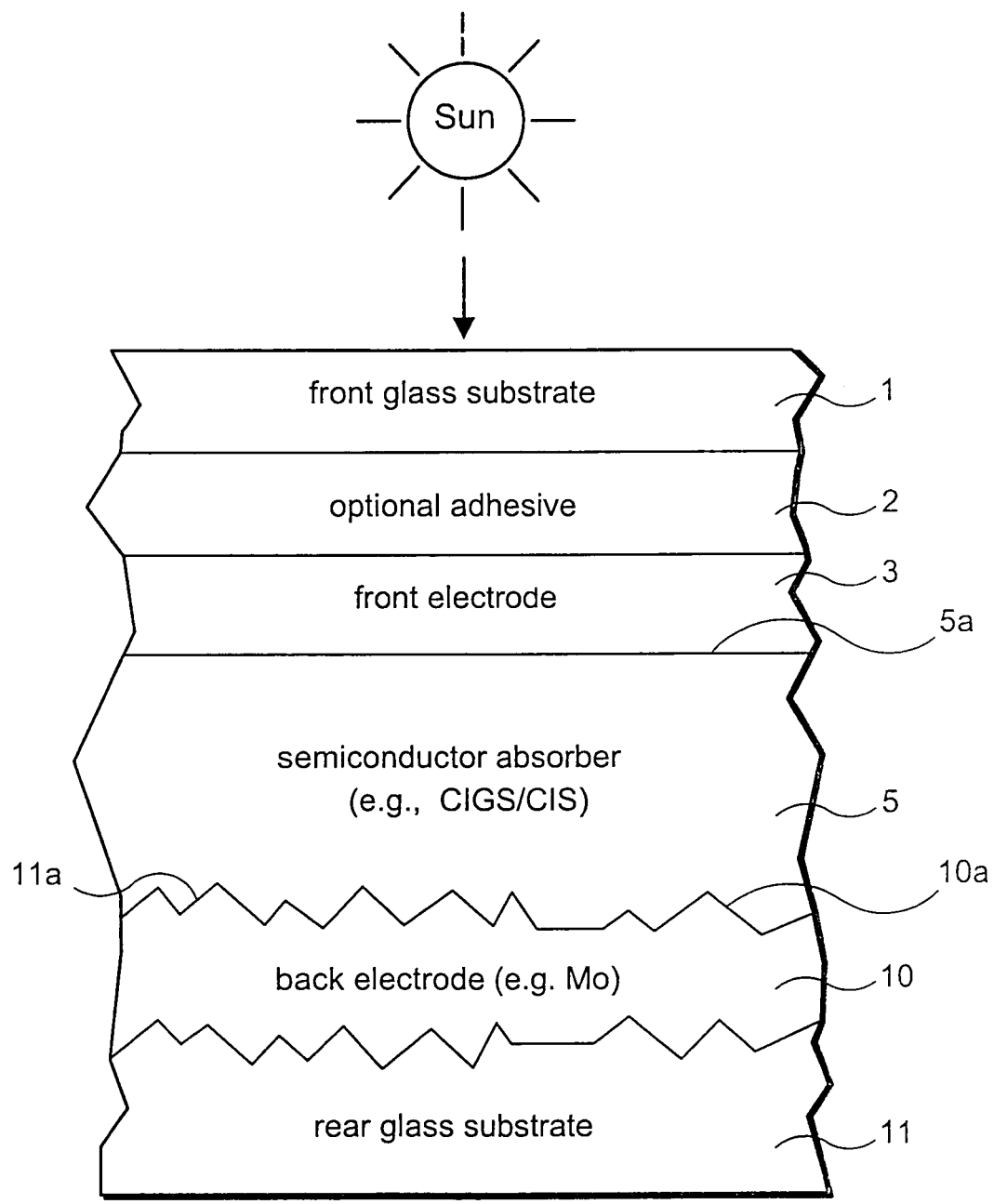

FIGS. 1(a) and 1(b) are cross sectional views of photovoltaic devices according to example embodiments of this invention, whereas FIGS. 2-5 are cross-sectional views of example rear electrodes and corresponding rear glass substrates that may be used in the photovoltaic device(s) of FIG. 1(a) and/or 1(b) in example embodiments of this invention.

Referring to FIGS. 1(a) and 1(b), the photovoltaic devices include transparent front glass substrate 1, optional adhesive film 2, single layer or multilayer front conductive electrode 3, active semiconductor film 5 of or including one or more semiconductor layers (such as CIGS, CIS, a-Si, or the like), electrically conductive back electrode/reflector 10, and rear glass substrate 11. Rear electrode 10 is preferably continuous or substantially continuous across all or a substantial portion of glass substrate 11, although it may be patterned into a desired design (e.g., stripes) in certain instances. The optional adhesive 2 may be of or include an electrically insulating polymer based and/or polymer inclusive encapsulant or adhesive of a material such as ethyl vinyl acetate (EVA), polyvinyl butyral (PVB), or the like. In certain example embodiments, polymer based adhesive layer 2 has a refractive index (n) of from about 1.8 to 2.2, more preferably from about 1.9 to 2.1, with an example being about 2.0, for purposes of enhancing internal reflection if textural back glass is used. Of course, other layer(s) which are not shown may also be provided in the device. For instance, buffer and/or window layer(s) may also optionally be provided.

Front glass substrate 1 and/or rear glass substrate 11 may be made of soda-lime-silica based glass in certain example embodiments of this invention; and front glass substrate 1 may have low iron content (e.g., less than about 0.10% total iron, more preferably less than about 0.08, 0.07 or 0.06% total iron) and/or an antireflection coating (not shown) thereon to optimize transmission in certain example instances. While substrates 1, 11 may be of glass in certain example embodiments of this invention, other materials such as quartz, plastic or the like may instead be used for substrate(s) 1 and/or 11. Glass substrate(s) 1 and/or 11 may or may not be thermally tempered in certain example embodiments of this invention. Additionally, it will be appreciated that the word "on" as used herein covers both a layer being directly on and indirectly on something, with other layers possibly being located therebetween.

Referring to FIGS. 1-5, a metal such as Mo (molybdenum) may be used as the rear electrode (bottom contact) 10 of a photovoltaic device, such as a CIS solar cell. In certain instances, the Mo may be sputter-deposited onto a soda or soda-lime-silica rear glass substrate 11 of the photovoltaic device. However, pure Mo rear electrodes suffer from the problem of delamination from the rear substrate 11.

Rear electrodes (e.g., Mo rear electrodes) 10 preferably have low stress, high conductivity, and good adhesion to the rear substrate (e.g., glass substrate) 11. In order to provide this combination of features, oxygen is introduced into the Mo based rear electrode 10 at the initial stage of deposition of the rear electrode on the substrate 11 or otherwise in certain example embodiments of this invention. The application of the oxygen to the Mo-based rear electrode 10 reduces the overall stress of the rear electrode and at the same time promotes adhesion of the rear electrode 10 to the glass soda or soda lime silica glass substrate 11. However, in certain large sputter coaters designed for large substrate widths such as greater than one meter, it is sometimes difficult to control the uniformity of oxygen in the final rear electrode film due to the different pumping speeds between reactive gas (e.g., oxygen) and sputtering gas (e.g., Ar).

Figure 8:
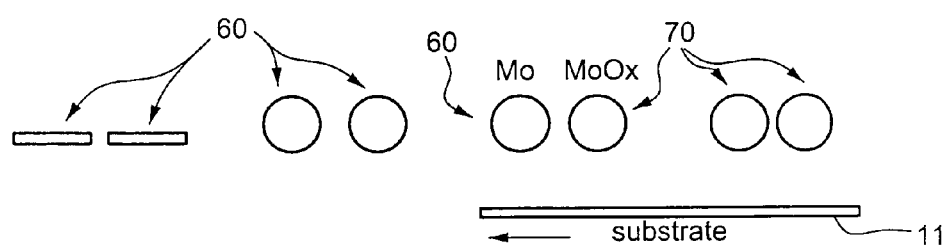
FIG. 8 is a schematic diagram illustrating an example of how an oxidation graded Mo inclusive rear electrode may be made for use in any of the FIG. 1-7 embodiments according to example embodiments of this invention.
Figure 9:
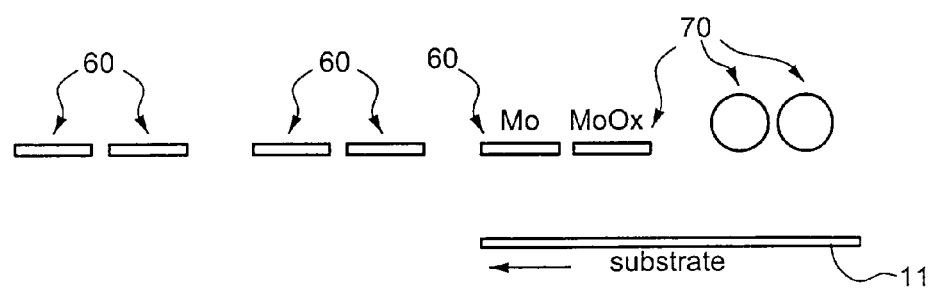
FIG. 9 is a schematic diagram illustrating another example of how an oxidation graded Mo inclusive rear electrode may be made for use in any of the FIG. 1-7 embodiments according to example embodiments of this invention; different types of sputtering targets are used in FIG. 9 compared to FIG. 8.

FIGS. 8-9 are schematic diagrams illustrating example techniques or methods for sputter-depositing rear electrodes 10 on substrates 11 (directly or indirectly) in certain example embodiments of this invention. As shown in FIGS. 8-9, in certain example embodiments of this invention, instead of using only metallic Mo targets 60 to sputter-deposit the Mo-based rear electrode 10 on the rear substrate 11, ceramic $MoO_x$ (where x is from 0.001 to 0.25, more preferably from about 0.01 to 0.2, even more preferably from about 0.01 to 0.15, and most preferably from about 0.03 to 0.10) target(s) 70 are also or instead used. The ceramic $MoO_x$ sputtering target(s) 70 may or may not be used in combination with metallic Mo sputtering target(s) 60 in certain example embodiments of this invention. By using ceramic $MoO_x$ sputtering target(s) 70 at least during the initial deposition phase of the rear electrode 10, little or no oxygen is introduced into the atmosphere surrounding the target during sputtering and thus the content and/or stoichiometry of the resulting thin film rear electrode composition is easier to control. In certain example embodiments only Ar gas (or other inert gas) is introduced proximate the Mo inclusive target(s) 60 and/or 70 during sputter-deposition of the rear electrode 10. In other words, in certain example embodiments little or no oxygen gas is introduced proximate the Mo inclusive targets 60 and 70 during sputtering thereof in forming the rear electrode. In certain example embodiments, $H_2$ gas or any other suitable gas may also be introduced along with the Ar gas in order to further reduce oxygen concentration in the rear electrode. In other words, the final film composition of electrode 10 is controlled more or mainly by the target(s) composition in at least part of the thin film rear electrode 10.

Still referring to FIGS. 8-9, in certain example embodiments, by using a co-sputtering approach utilizing at least adjacent targets, one or more of metallic Mo 60 and the other or more of ceramic $MoO_x$ 70, an oxygen graded composition through at least part of the thickness of the Mo-based rear electrode 10 may be provided as shown for example in FIGS. 1(a), 3(a), 3(b), 3(c), 4 and 5. This is advantageous in that the oxidation grading has been found to enhance durability of the rear electrode 10 and thus of the photovoltaic device. As shown in FIGS. 1(a), 3(a), 3(b), 3(c), 4 and 5, due to the arrangement of $MoO_x$ and Mo targets in FIGS. 8-9, the rear electrode 10 is oxidation graded (continuously or discontinuously) in a manner so that the electrode 10 is more oxided at a location therein closer to the rear substrate 11 than at a location therein farther from the rear substrate 11.

The $MoO_x$ and Mo targets 70 and 60, respectively, used in co-sputtering or co-deposition may be rotating sputtering target(s) (see the round targets in FIGS. 8-9) and/or stationary planar target(s) (see the planar shaped targets in FIGS. 8-9). Such target(s) 60 and/or 70 may be fabricated by casting, isostatic press, extrusion, or spraying in different example embodiments of this invention.

While the targets 60 and 70 are Mo-based, and the rear electrode 10 is Mo-based in the illustrated embodiments of this invention, this invention is not so limited. Other metal(s) (M) may be used instead of Mo in the rear electrode 10 and/or in the target(s) 60, 70.

In the FIG. 1(a) embodiment of this invention, the Mo-based rear electrode (which may be oxidation graded as discussed herein) is supported by a substantially flat surface of the rear substrate 11. However, in other example embodiments (e.g., see FIGS. 1(b), 2, 3(a), 4 and 5), the rear electrode may be formed on a textured surface of the rear substrate 11.

With respect to FIGS. 1(b), 2, 3(a), 4 and 5, the interior surface of the rear glass substrate 11 is macroscopically textured in order to improve reflective scattering, and the rear electrode 10 (which may or may not be oxidation graded as discussed herein) is deposited (e.g., via sputtering or the like) on the textured surface 11a of the substrate 11. Rear electrode 10 is thus able to reflect significant amounts of light in the 500-800 nm, and/or 600-800 nm wavelength range, thereby permitting such light to be trapped or to go through a long path in the semiconductor film 5 to enhance the photovoltaic efficiency of the device. In certain example embodiments, the macroscopically textured interior surface 11a of glass substrate 11 may have any suitable textured pattern, such as a pyramid pattern obtained by rolling or the like, a random pattern achieved by ion beam treatment, rolling, and/or acid etching. This textured pattern may have a periodicity of from about 20 to 200 μm (more preferably from about 40 to 100 μm) in certain example embodiments, depending on the capabilities of the glass patterning line, ion beam treatment, and/or etching process. Other possible patterns for the interior surface 11a of glass 11 include triangular or sawtooth trough patterns and, in general, any combination of slanted patterns which maximizes or substantially maximizes multiple internal reflections.

In certain example embodiments of this invention, rear electrode 10 comprises Mo (molybdenum) and is provided on, directly or indirectly, rear glass substrate 11. The Mo inclusive rear electrode 10 is formed in a manner so that its major surface 10a to be closest to the light absorption semiconductor film 5 is textured (roughened) in a substantially controlled and desired manner (e.g., see FIGS. 1(b), 2, 3(a), 4 and 5). In certain example embodiments, the interior surface 11a of the rear glass substrate 11 is textured (roughened) via acid etching, ion beam treatment, or the like. Then, after the glass substrate 11 is textured, the Mo-based rear electrode 10 is formed on the textured surface 11a of the rear glass substrate 11 in a manner so that the major surface 10a of the rear electrode 10 to be closest to the light absorption semiconductor film 5 is also textured. In certain example embodiments, the textured major surface 10a of the rear electrode 10 to be closest to the light absorption semiconductor film may be substantially conformal to the textured surface 11a of the rear glass substrate 11. The textured surface(s) of the rear electrode 10 permit(s) the rear electrode to provide both desirable electrical and reflective characteristics.

The textured interior surface 10a of the rear electrode 10 is advantageous in several example respects. The textured surface 10a of the rear electrode 10 allows the rear electrode to act as a scattering back electrode thereby permitting it to reflect incident light (light which has come into the device from the sun or the like and passed through the front electrode 3 and film 5) more effectively and efficiently back into the light absorption semiconductor film 5. This can allow one of both of: improved efficiency of the photovoltaic device, and/or reduced thickness of the light absorption semiconductor film 5 without sacrificing solar efficiency.

Still with respect to FIGS. 1(b), 2, 3(a), 4 and 5, in certain example embodiments, after the rear electrode 10 has been formed on the rear glass substrate 11, the major surface of the rear electrode 10 to be closest to the light absorption semiconductor film 5 may be textured via one or more of ion beam treatment, plasma exposure, and/or a wet chemical etch such as HCl, nitric acid, acetic acid or a combination thereof, to form textured surface 10a. This post-deposition texturing (roughening) of the rear electrode surface 10a may, or may not, be used in combination with embodiments where the rear glass substrate is textured. Thus, when the surface 10a of the rear electrode 10 is textured (roughened) after the deposition of the rear electrode on the substrate 11, the rear glass substrate 11 may or may not be textured.

Because of this improved back electrode structure (10 and/or 11) which provides improved reflection back into the semiconductor film 5, the front electrode 3 and/or front substrate 1 need not be textured (although it or they may be in certain instances). Moreover, the light incident surface 5a of the semiconductor film 5 need not be textured (although it may be in certain instances). Because the front electrode 3 and semiconductor film 5 may be smooth or substantially smooth, the reliability and/or manufacturing yield of the device can be improved, and possibly a thinner semiconductor film 5 may be used in certain example instances. Moreover, the front electrode 3 may be a multi-layer coating including at least one silver layer or the like to be used to form the front electrode 3 in certain example instances; such coatings for electrode 3 may have an improved (e.g., lower) sheet resistance while at the same time maintaining high transmission in the part of the spectrum in which the photovoltaic device is sensitive (e.g., 350 to 750, 350 to 800 nm, or possibly up to about 1100 nm for certain types). Low sheet resistance is advantageous in that it allows for less dense laser scribing and may lead to lower scribe losses. Furthermore, the total thickness of such a multilayer front electrode 3 may be less than that of a conventional TCO front electrode in certain example non-limiting instances, which can reduce the cost of the product and increase throughput. Example multi-layer coatings for the front electrode 3 are described in U.S. Ser. No. 11/724,326, the disclosure of which is hereby incorporated herein by reference.

Figure 2:
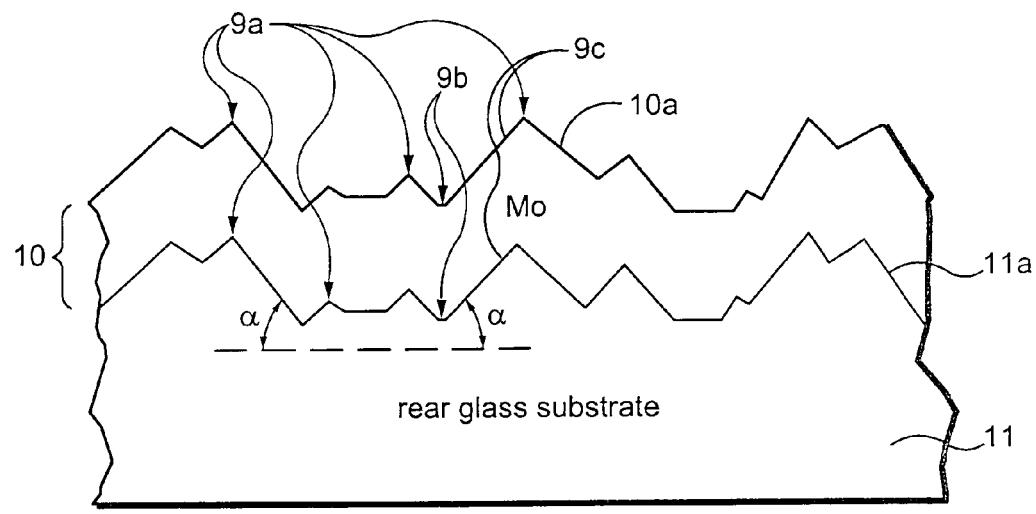
FIG. 2 is a cross-sectional view of an example rear electrode and rear glass substrate that may be used in the photovoltaic device of FIG. 1(b) in an example embodiment of this invention.

FIG. 2 is an enlarged cross-sectional view of an example rear electrode structure for use in the photovoltaic device of FIG. 1(b) in an example embodiment of this invention. FIG. 2 illustrates that the rear electrode structure includes rear glass substrate 11 which may be substantially transparent, and rear electrode 10. In the FIG. 2 embodiment the rear electrode 10 is of or includes Mo, and may be metallic or substantially metallic (possibly oxidation graded as discussed herein) so as to be reflective. In the FIG. 2 embodiment, the textured surfaces 10a and 11a of the rear electrode 10 and rear glass substrate 11, respectively, have peaks 9a, valleys 9b between the peaks, and inclined portions 9c connecting the peaks and valleys.

Referring to FIGS. 1(b), 2, 3(a), 4 and 5, incident light from the sun makes its way first through front substrate 1 and front electrode 3, and into semiconductor film 5. Some of this light proceeds through semiconductor film 5 thereby reaching rear electrode 10, and is reflected by the rear electrode 10 which is provided on the interior textured surface of the rear substrate 11. It has been found that especially good reflection occurs in certain example instances when reflective rear electrode 10 includes inclined portions 9c which form an angle(s) $\alpha$ with the plane (and/or rear surface) of the rear substrate 11, where $\alpha$ is at least about 20 degrees, more preferably from about 25-50 degrees, even more preferably from about 25-40 or 25-35 degrees (note: angle $\alpha$ is shown in FIG. 2 with respect to the inclined portions 9c of the rear substrate, but this also applies to the inclined portions 9c of the rear electrode 10). While not shown in FIGS. 3-5 for purposes of simplicity, this concept regarding angle(s) $\alpha$ is also applicable to those figures. Causing this angle $\alpha$ to be within such a range for at least some inclined portions is advantageous in that more light is kept in the cell (i.e., in the semiconductor 5 for conversion to current) so that the efficiency of the photovoltaic device is improved.

In certain example embodiments of this invention (e.g., see FIG. 1), a single layer front electrode 3 may be used in the device. An example single-layer front electrode 3 may be of a TCO such as tin oxide (possibly fluorinated), zinc oxide, ITO, or the like.

In other example embodiments, a multilayer front electrode 3 may be used in the photovoltaic device. Example multilayer front electrodes 3 are described in U.S. Ser. Nos. 11/724,326 filed Feb. 27, 2007 and 11/591,668 filed Nov. 2, 2006 (both hereby incorporated herein by reference in their entireties), for purposes of example. Such an example multilayer front electrode 3 includes from the glass substrate 1 moving toward the semiconductor film 5, a first transparent conductive oxide (TCO) layer, a first conductive substantially metallic IR reflecting layer (e.g., of Ag or the like), a second TCO layer, second conductive substantially metallic IR reflecting layer (e.g., of Ag or the like), a third TCO layer, and optionally a buffer layer. Optionally, the first TCO layer may be a dielectric layer instead of a TCO in certain example instances and serve as a seed layer for the first conductive substantially metallic IR reflecting layer. Of course, it is possible for certain layers of this multilayer front electrode to be removed in certain alternative embodiments of this invention, and it is also possible for additional layers to be provided in the multilayer front electrode. Front electrode 3 may be continuous across all or a substantial portion of glass substrate 1 and may be flat in certain example instances (i.e., not textured), or alternatively may be patterned into a desired design (e.g., stripes), in different example embodiments of this invention. Each of layers/films 1-3 is substantially transparent in certain example embodiments of this invention.

The active absorption semiconductor region or film 5 may include one or more layers, and may be of any suitable material. In certain example embodiments of this invention, the absorption semiconductor film 5 is of or includes $ABC_x$, where A is a group IB element(s) such as Cu, Ag and/or Au, B is a group IIIA element(s) such as In and/or Ga, C is a group VI element(s) such as Se and/or S, and x is from about 1.5 to 2.5, more preferably from about 1.9 to 2.1, with an example value of x being about 2.0. Thus, the semiconductor film 5 may be of or include CIGS (approximately Cu(In or Ga)(Se or S)$_2$) and/or CIS (approximately CuInSe$_2$) in certain example embodiments. The active semiconductor film 5 may be formed by any suitable technique, including but not limited to vacuum evaporation or the like. Alternatively, the semiconductor film 5 may be of or include a-Si or other suitable material in certain instances.

Rear conductive electrode 10 (sometimes referred to as a back contact) may be oxidation graded and may include one or more layers, and comprises molybdenum (Mo) in certain example embodiments. Part or all of the rear electrode 10 may be oxidation graded in different example embodiments of this invention. In certain example embodiments, the rear electrode 10 is in direct contact with the semiconductor film 5. Rear electrode 10 may be formed via sputtering or any other suitable technique in different example embodiments of this invention.

FIG. 2 is a cross-sectional view of an example conductive and substantially opaque rear electrode (and reflector) 10 and rear glass substrate 11 that may be used in the photovoltaic device of FIG. 1(b) in an example embodiment of this invention. In the FIG. 2 embodiment, the rear electrode 10 is of a single metallic or substantially metallic layer of Mo which may or may not be oxidation graded. The conductive and reflective Mo electrode 10 may optionally be doped with small amounts of other elements in certain instances. The thickness of the Mo electrode 10 may be varied depending on the desired sheet resistance of the rear electrode. In certain example instances, the Mo electrode 10 in the FIG. 2 embodiment may be from about 1500 to 5000 Å thick, more preferably from about 2500 to 4500 Å thick.

Figure 3A:
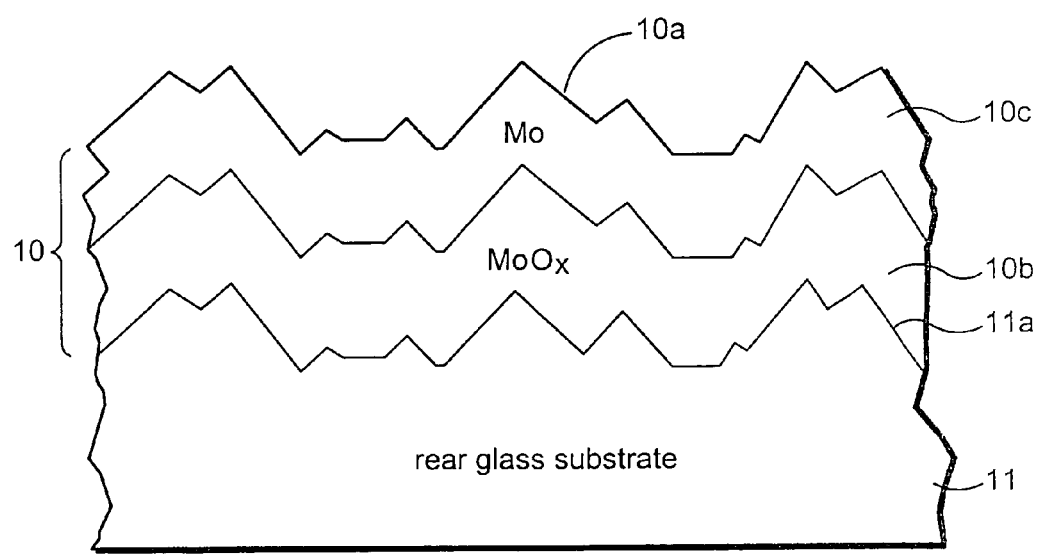
FIG. 3(a) is a cross-sectional view of another example rear electrode and rear glass substrate that may be used in the photovoltaic device of FIG. 1(b) in an example embodiment of this invention.
Figure 3B:
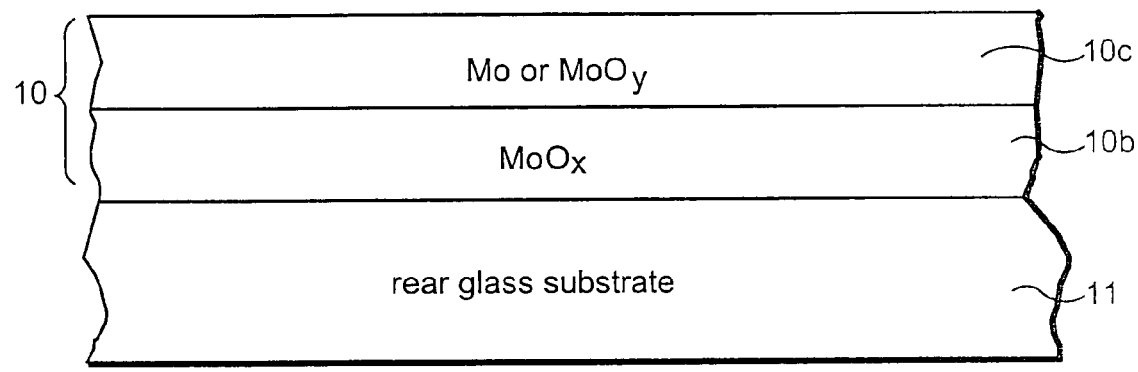
FIGS. 3(b) and 3(c) are cross-sectional views of other example rear electrodes and corresponding rear glass substrates that may be used in the photovoltaic device of FIG. 1(a) in example embodiments of this invention.
Figure 3C:
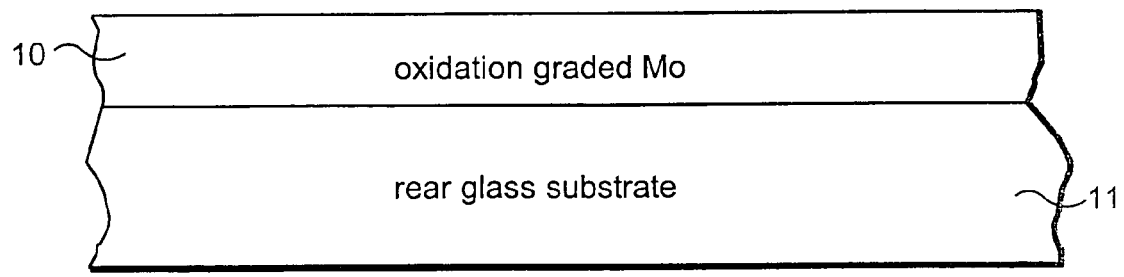

FIG. 3(a) is a cross-sectional view of an example conductive and substantially opaque rear electrode (and reflector) 10 and rear glass substrate 11 that may be used in the photovoltaic device of FIG. 1(b) in another example embodiment of this invention, whereas FIGS. 3(b) and 3(c) are cross-sectional views of example conductive and substantially opaque rear electrode 10 and substrates 11 that may be used in the photovoltaic devices of FIG. 1(a). Referring to FIGS. 3(a)-(c), the rear electrode 10 in this embodiment is the same as that discussed above with the following exceptions. In the FIG. 3 embodiment, the rear electrode 10 includes a first layer or layer portion 10b of or including an oxide of Mo (molybdenum) (e.g., MoO$_x$, where in certain example embodiments x may be from about 0.2 to 1.0, more preferably from about 0.5 to 1.0) which may have been sputter-deposited using MoO$_x$ target(s) 70 in FIGS. 8-9, and a second metallic or substantially metallic layer or layer portion 10c of or based on Mo that may have been sputter-deposited on substrate 11 using the metallic Mo target(s) 60 in FIGS. 8-9. The thickness of the Mo layer 10c may be varied depending on the desired sheet resistance of the rear electrode 10. In certain example instances, the Mo layer 10c may be from about 1500 to 5000 Å thick, more preferably from about 2500 to 4500 Å thick, and the MoO$_x$ layer 10b may be from about 50 to 1000 Å thick, more preferably from about 100 to 600 Å thick, and most preferably from about 200 to 300 Å thick. While the Mo layer 10c may be deposited by sputtering a Mo target(s) in certain example embodiments in an atmosphere of argon gas or the like, the $MoO_x$ layer 10b may be deposited by sputtering a Mo or $MoO_x$ target(s) (e.g., in an argon, or an argon/oxygen gas atmosphere). As shown by FIGS. 3(b)-(c), the oxidation graded Mo-based rear electrode 10 may be considered a single-layer or multiple-layer electrode 10 in different instances. In certain example embodiments, the Mo based layer 10c may or may not be oxidation graded, continuously or discontinuously, so as to be more metallic at a location therein closer to the semiconductor film 5 than at a location therein closer to the substrate 11. These layers 10b and/or 10c may be sputter-deposited at room temperature in certain example embodiments, or also may be deposited in heat vacuum chamber(s). Optionally, the glass 11 may be heated when one or both of these layers is sputter-deposited in certain example instances. Heating the glass (e.g., using temperatures of from about 150-300 degrees C., more preferably from about 200-250 degrees C.) may be advantageous in that the heat causes a more dense Mo-based layer to be formed thereby resulting in lower sheet resistance for the layer. Thus, for a given sheet resistance, a thinner Mo layer 10c may be used in certain example instances.

Still referring to at least the FIG. 3 embodiment (and the FIG. 4-5 embodiments where Mo oxide may also be used in the rear electrode), it has been found that sodium (Na) migration from the rear glass substrate 11 improves the performance of CIS and/or CIGS photovoltaic devices. In particular, it has been found that sodium migration from the rear glass substrate 11 to the surface of the Mo based layer 10 closest to the semiconductor improves the performance of CIS and/or CIGS photovoltaic devices. From about 3-5% sodium migration to the surface of the Mo based electrode has been found to be particularly beneficial in certain example instances. Accordingly, it has been found that such sodium migration from the glass 11 is desired to some extent. It has surprisingly been found that the presence of the $MoO_x$ layer or layer portion 10b helps accelerate such sodium migration from the rear glass substrate 11 to the surface of the Mo based electrode 10 during heat treatment at high temperatures used during processing/manufacturing of the device. Thus, it will be appreciated that the use of the $MoO_x$ layer 10b in the rear electrode is highly advantageous in certain example embodiments of this invention due to its ability to increase Na diffusion from the glass 11 to the surface of the electrode 10 adjacent the semiconductor 5 and possibly into the semiconductor 5. The $MoO_x$ layer or layer portion 10b may be conductive, semiconductive, or non-conductive in different embodiments, depending on the amount of oxygen provided in the layer. Small amounts of other element(s) may also be provided in layer(s) 10b and/or 10c in certain instances.

Figure 4:
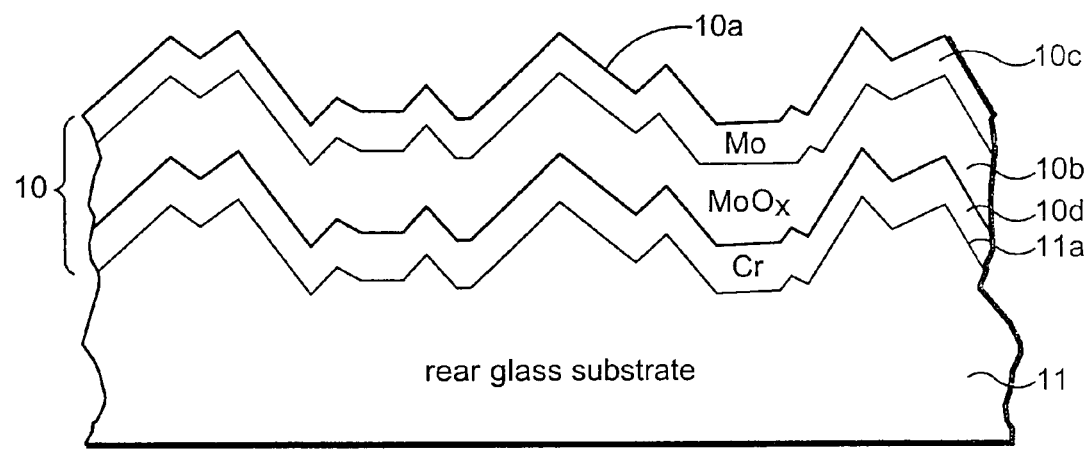
FIG. 4 is a cross-sectional view of another example rear electrode and rear glass substrate that may be used in the photovoltaic device of FIG. 1(a) or 1(b) in example embodiments of this invention.

FIG. 4 is a cross-sectional view of an example conductive and substantially opaque rear electrode (and reflector) 10 and rear glass substrate 11 that may be used in the photovoltaic device of FIG. 1(b) (or FIG. 1(a)) in another example embodiment of this invention. The rear electrode 10 in this embodiment is the same as that discussed above with respect to FIGS. 1-3 with the following exceptions. In the FIG. 4 embodiment, the rear electrode 10 includes a first metallic or substantially metallic layer 10d of or based on Cr, a second layer or layer portion 10b of or including an oxide of Mo (molybdenum) (e.g., $MoO_x$, where in certain example embodiments x may be from about 0.2 to 1.0, more preferably from about 0.5 to 1.0), and a third metallic or substantially metallic layer or layer portion 10c of or based on Mo. In certain example embodiments, the Cr based layer 10d may be from about 50 to 1000 Å thick, more preferably from about 100 to 600 Å thick, and most preferably from about 200 to 300 Å. Example thicknesses of, and deposition techniques for, layers 10b and 10c are discussed above. It has been found that the Cr layer 10d is advantageous in that it permits better adhesion of the layer 10b and/or 10c to the glass 11. In alternatives of the FIG. 4 embodiment, the $MoO_x$ layer 10b may be omitted so that the Cr layer 10d and the Mo layer 10c directly contact each other (this may serve to advantageously reduce the sheet resistance of the rear electrode in certain example instances). The Cr layer 10d may include other element(s) such as Ni and/or oxygen in certain example instances.

Figure 5:
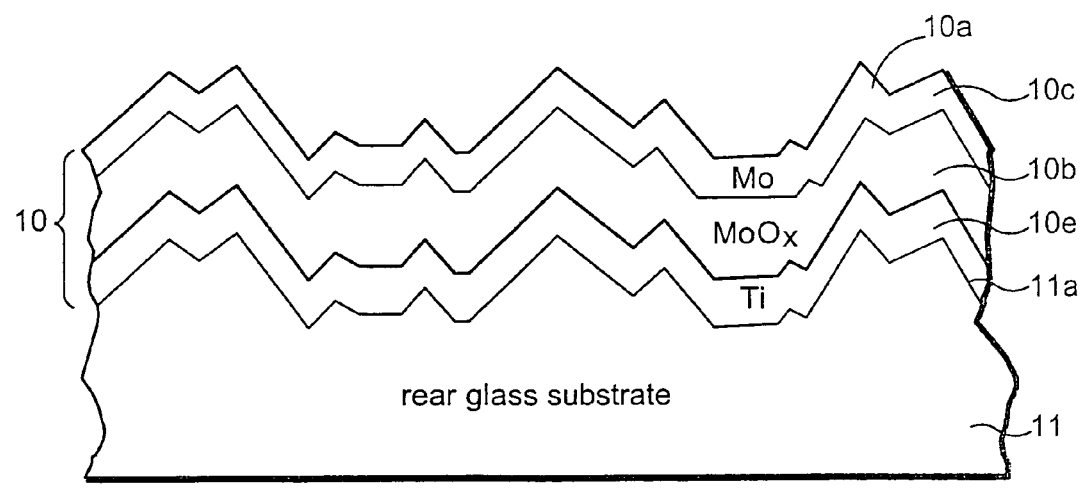
FIG. 5 is a cross-sectional view of another example rear electrode and rear glass substrate that may be used in the photovoltaic device of FIG. 1(a) or 1(b) in example embodiments of this invention.

FIG. 5 is a cross-sectional view of an example conductive and substantially opaque rear electrode (and reflector) 10 and rear glass substrate 11 that may be used in the photovoltaic devices of FIG. 1 in another example embodiment of this invention. The rear electrode 10 in this embodiment is the same as that discussed above with respect to FIGS. 1-3 with the following exceptions. In the FIG. 5 embodiment, the rear electrode 10 includes a first metallic or substantially metallic layer 10e of or based on Ti, a second layer or layer portion 10b of or including an oxide of Mo (molybdenum) (e.g., $MoO_x$, where in certain example embodiments x may be from about 0.2 to 1.0, more preferably from about 0.5 to 1.0), and a third metallic or substantially metallic layer or layer portion 10c of or based on Mo. In certain example embodiments, the Ti based layer 10e may be from about 50 to 1000 Å thick, more preferably from about 100 to 600 Å thick, and most preferably from about 200 to 300 Å thick. Example thicknesses of, and deposition techniques for, layers 10b and 10c are discussed above. It has been found that the Ti layer 10d is advantageous in that it permits better adhesion of the layer 10b and/or 10c to the glass 11. In alternatives of the FIG. 5 embodiment, the $MoO_x$ layer 10b may be omitted so that the Ti layer 10e and the Mo layer 10c directly contact each other (this may serve to advantageously reduce the sheet resistance of the rear electrode in certain example instances). The Ti layer 10e may include other element(s) such as nitrogen and/or oxygen in certain example instances.

It is of course possible for other layers to be provided, or for certain layers to be omitted, in other example embodiments of this invention.

Figure 6:
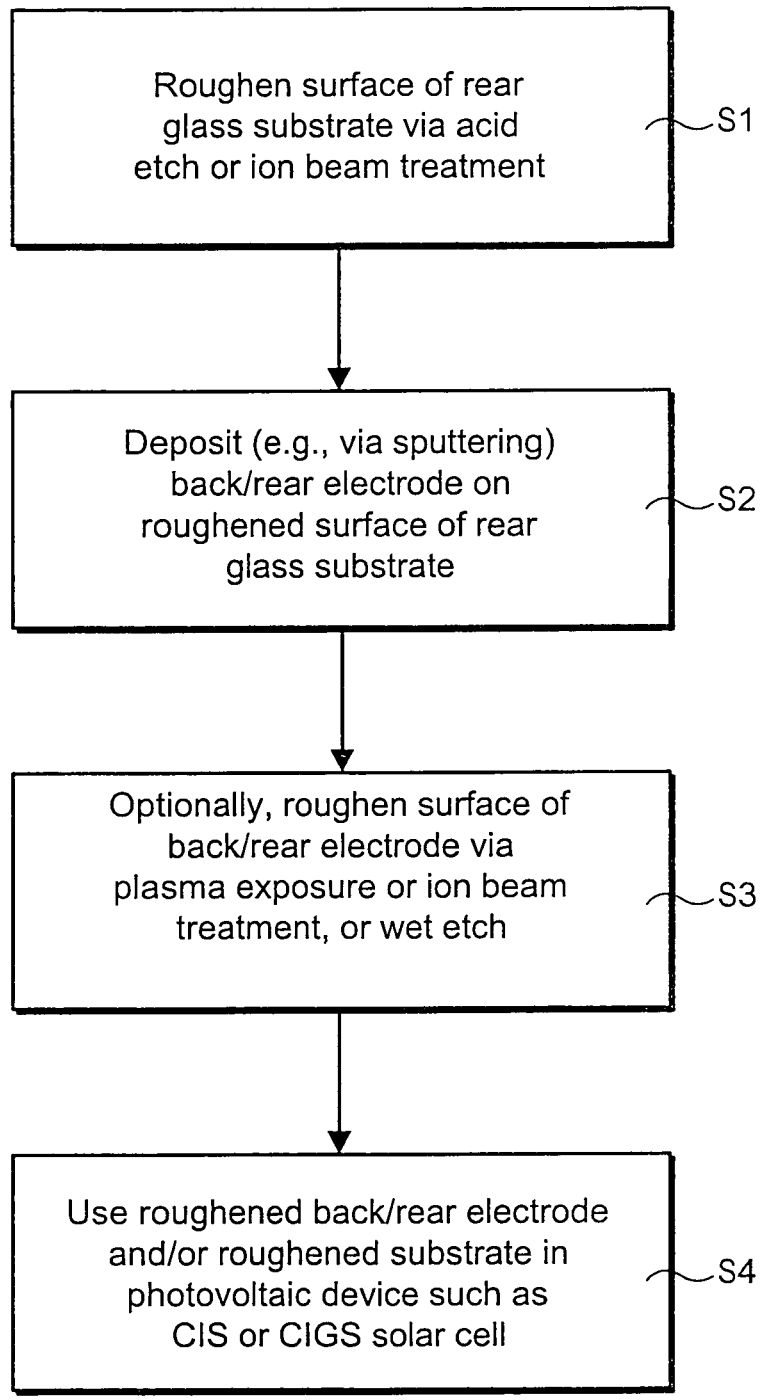
FIG. 6 is a flowchart illustrating how a rear electrode structure and/or photovoltaic device may be made according to an example embodiment of this invention (e.g., with respect to FIGS. 1(b), 2, 3(a), and 4-5).

FIG. 6 is a flowchart illustrating steps taken in making a photovoltaic device according to an example embodiment of this invention relating to textured rear substrates as shown in FIGS. 1(b), 2, 3(a), 4 and 5. Rear glass substrate 11 (e.g., soda-lime-silica based glass) is provided. The surface of the glass substrate to be closest to the semiconductor 5 is textured (roughened) as discussed above using any suitable technique, such as via ion beam treatment and/or acid etching (S1). If ion beam treatment is used, example ion sources and ion beam treating techniques are described in U.S. Pat. Nos. 7,049,003 and 6,878,403, the disclosures of which are hereby incorporated herein by reference. Then, the rear electrode 10 is deposited (e.g., via sputtering or the like) on the textured surface 11a of the rear glass substrate 11 so as to be substantially continuous across substantially the entire surface 11a of substrate; any rear electrode 10 discussed herein may be used (S2). Optionally, after the rear electrode 10 has been formed on the rear glass substrate 11, the major surface 10a of the rear electrode 10 to be closest to the light absorption semiconductor film 5 may be textured via one or more of ion beam treatment, plasma exposure, and/or a wet chemical etching such as HCl, nitric acid, and/or acetic acid or a combination thereof (S3). Again, if ion beam treatment is used in step S3, example ion sources and ion beam treating techniques are described in U.S. Pat. Nos. 7,049,003 and 6,878,403, which are incorporated herein by reference. After step S3, the rear electrode 10 may still be substantially continuous across substantially the entire surface 11a of the substrate. After the formation of the rear electrode 10 has been completed, then in certain example instances the semiconductor film 5 and front electrode 3 may then be deposited on the glass substrate 11 over the roughened rear electrode 10. Then, the front substrate 1 may be laminated to the rear glass substrate 11 via adhesive 2 or the like. The rear electrode structure is thus used in a photovoltaic device (S4).

Figure 7:
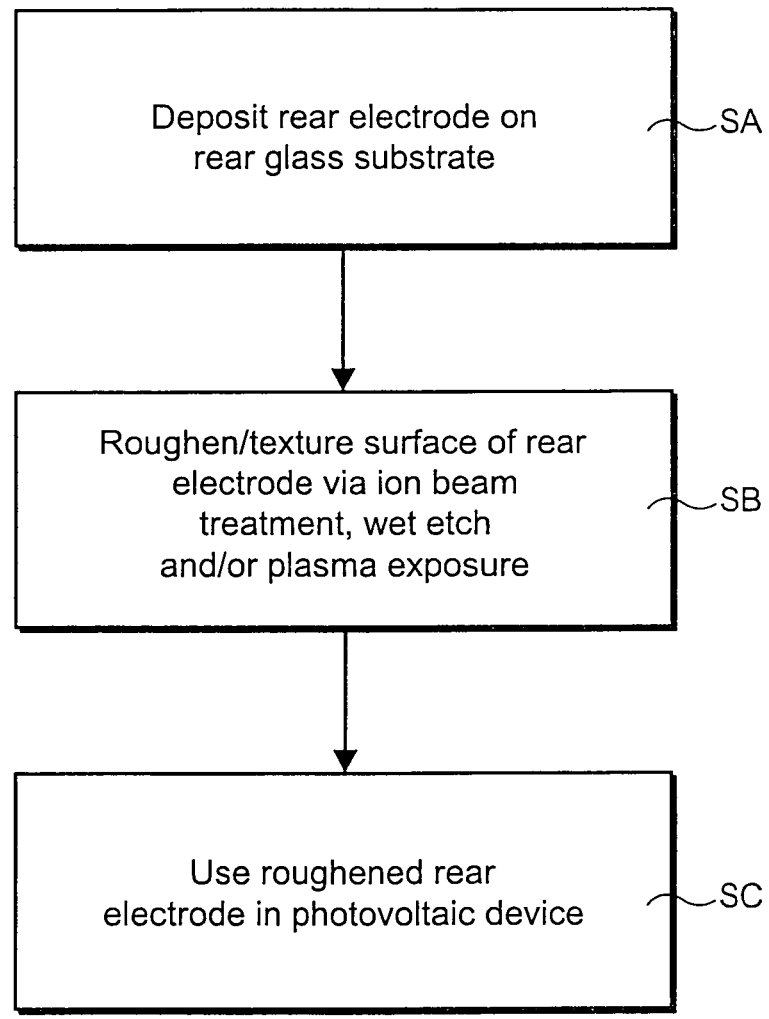
FIG. 7 is a flowchart illustrating how a rear electrode structure and/or photovoltaic device may be made according to another example embodiment of this invention (e.g., with respect to FIGS. 1(b), 2, 3(a), and 4-5).

FIG. 7 is a flowchart illustrating steps taken in making a photovoltaic device according to another example embodiment of this invention relating to textured rear substrates as shown in FIGS. 1(b), 2, 3(a), 4 and 5. This embodiment is the same as the FIG. 6 embodiment, except that the surface 11a of the rear glass substrate 11 need not be textured. In the FIG. 7 embodiment, rear glass substrate 11 (e.g., soda-lime-silica based glass) is provided (textured or not textured). Then, the rear electrode 10 is deposited (e.g., via sputtering or the like) on a major surface of the rear glass substrate 11 so as to be substantially continuous across substantially the entire surface of the substrate (SA); any rear electrode 10 discussed herein may be used. After the rear electrode 10 has been formed on the rear glass substrate 11, its major surface to be closest to the semiconductor may or may not be textured. The major surface 10a of the rear electrode 10 to be closest to the light absorption semiconductor film 5 is then textured via one or more of ion beam treatment, plasma exposure, and/or a wet chemical etching such as HCl, nitric acid, and/or acetic acid or a combination thereof (SB). Again, if ion beam treatment is used in step SB, example ion sources and ion beam treating techniques are described in U.S. Pat. Nos. 7,049,003 and 6,878,403, which are incorporated herein by reference. After SB, the electrode 10 may still be provided across substantially the entire surface of substrate 11. Then, in certain example embodiments, the semiconductor film 5 and front electrode 3 may then be deposited on the glass substrate 11 over the roughened rear electrode 10. Then, the front substrate 1 may be laminated to the rear glass substrate 11 via adhesive 2 or the like in forming a photovoltaic device. The rear electrode structure is thus used in a photovoltaic device (SC).

Figure 10:
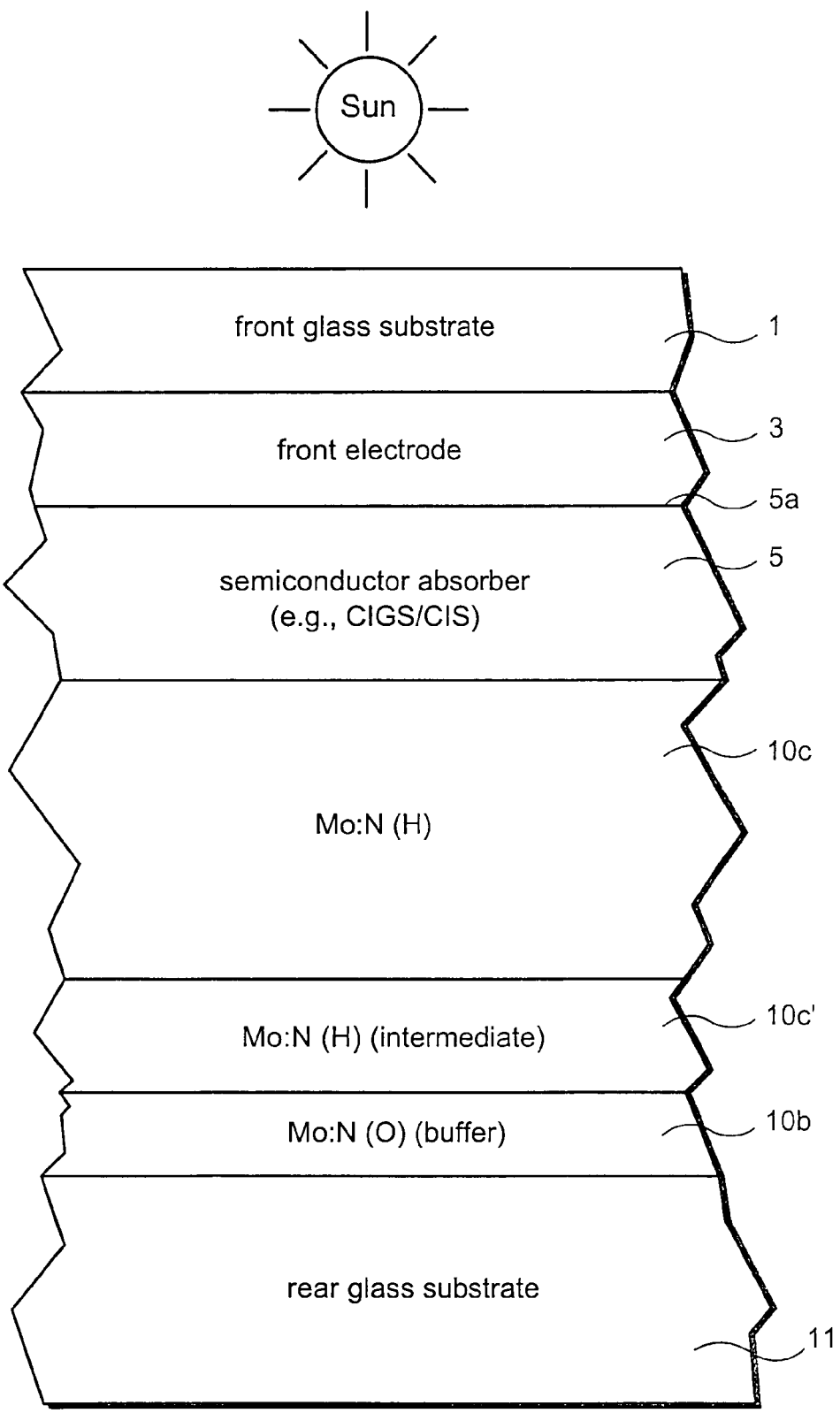
FIG. 10 is a cross-sectional view of another example rear electrode and rear glass substrate that may be used in a photovoltaic device of any embodiment herein, according to examples of this invention.
Figure 11:
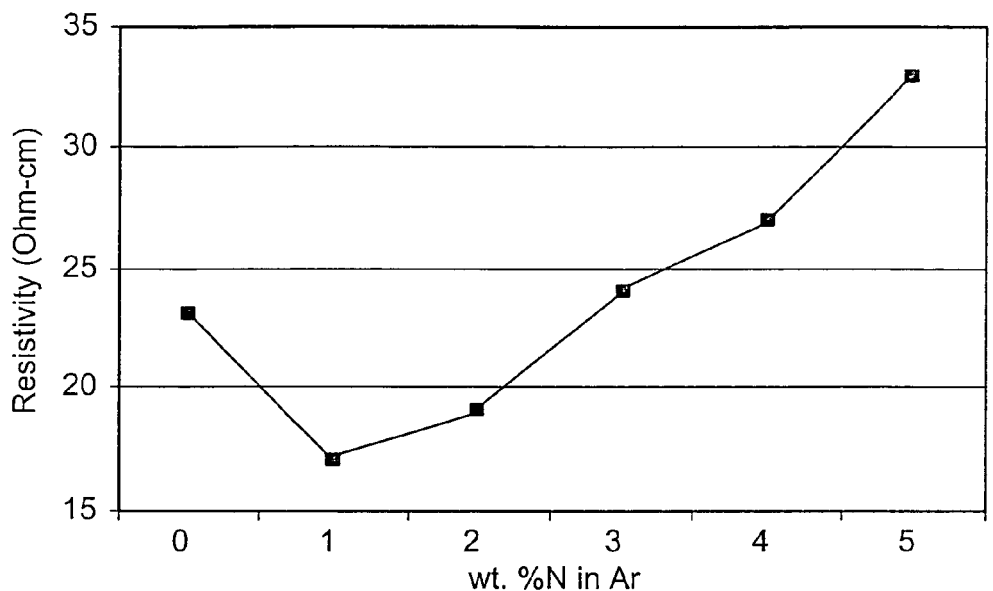
FIG. 11 is a percent nitrogen gas flow vs. resistivity graph illustrating how the introduction of nitrogen gas into the sputtering process for the rear electrode in certain example embodiments of this invention affects conductivity (and thus resistivity) of the rear electrode.
Figure 12:
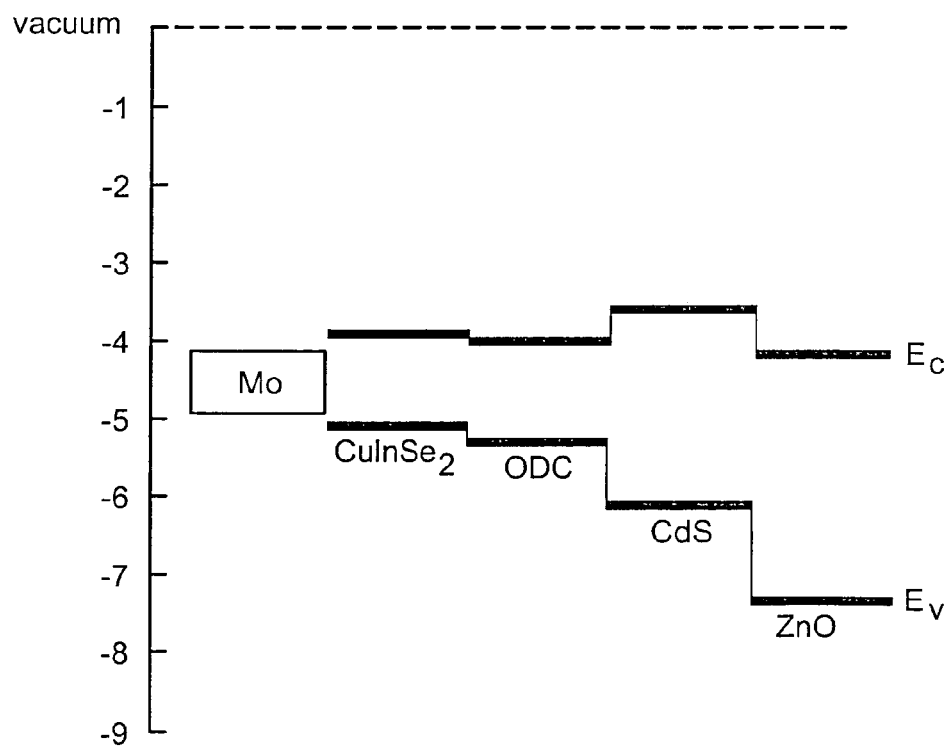
FIG. 12 is an energy diagram of an example CIS photovoltaic device.

Referring to FIGS. 10-12, further example embodiments of this invention will now be described. The embodiments discussed below in connection with FIGS. 10-12 may (or may not) be used in connection with any of the other embodiments such as illustrated in FIGS. 1-9.

Cupper-indium-diselenide (CIS) and cupper-indium-gallium-diselenide (CIGS) based photovoltaic devices (e.g., solar cells) are good with respect to efficiency among thin-film solar cells, in excess of 17% approaching that of crystalline silicon devices. A CIS and/or CIGS device (which may be referred to herein as a CIS device) is commercially fabricated to include a molybdenum (Mo) based rear electrode layer on a glass substrate which is then patterned (or scribed) by a laser to form individual contacts or electrodes. The quality of the laser scribe is importance to ensure high module efficiency. Thereafter, the rest of the stack is deposited, including for example the CIS layer, CdS layer, and a transparent conductive oxide such as tin oxide or zinc oxide as the front electrode. An ordered defect chalcopyrite (ODC) can form at the CIS/CdS interface. Solar light enters the device through the wide-bandgap front transparent electrode (e.g., ZnO) and induces the electron-hole pair generation in the CIS absorber film. The positive and negative charges are divided by the electric field and exit the device through the top and bottom electrodes.

It is desirable for the Mo based rear electrode 10 to possess certain qualities in order to serve as a good electrode. In certain example embodiments, rear Mo based electrodes 10: have a low sheet resistance (typically less than 1 Ω/sq) to effectively conduct the extracted holes (e.g., for this a certain grain size and grain structure should be achieved); have a low contact resistance to the CIS absorber; are effective diffusers of sodium from soda-lime glass substrate 11 to the absorber 5 during the device-making high-temperature processing (this is beneficial for the efficient large-grain CIS growth); have a sufficiently rough surface to promote a better adhesion of the absorber 5 to the contact 10; have a proper work function (WF) to provide an ohmic contact for the extracted holes; and ensure both good adhesion to soda-lime glass 11 and high quality of the laser scribe.

Room-temperature magnetron sputtering (of Mo or MoOx based targets) in Ar gas has proved successful as an effective way of Mo deposition for such electrodes 10. However, a disadvantage of a single-layer configuration of Mo for the rear electrode is its low sodium permeability. Furthermore, large-area Mo deposition is often desired to drive the cost of the module down.

In order to address the above issues, in certain example embodiments of this invention there is provided a method of making the rear electrode 10 for CIS and/or CIGS photovoltaic (e.g., solar cell) devices using magnetron sputter-deposition of molybdenum (Mo) in a multi-layer configuration. In certain example embodiments, nitrogen and/or hydrogen gases are used as additives to the sputtering gas (e.g., argon) to reduce stress of the rear electrode coating, enhance its resistance to the selenization during the downstream device-making processing, and promote beneficial sodium migration from the soda-lime rear glass substrate 11 to the semiconductor film 5 of the device.

Referring to FIGS. 10-12 for example, certain example embodiments of this invention use the following steps in the fabrication of a Mo based rear electrode 10: (i) addition of nitrogen and/or hydrogen to the sputtering gas during the Mo deposition; (ii) use of multi-cathode sputter deposition; (iii) use of a buffer layer 10b (e.g., including MoOx, so as to have more oxygen than other areas of the Mo based rear electrode) between the rear glass substrate 11 and more conductive portions of the rear electrode 10; and (iv) use of an intermediate stress-relieving layer 10c' between the buffer layer 10b and other portion(s) 10c of the Mo based rear electrode 10.

The use of hydrogen gas when sputtering Mo for the Mo-based rear electrode 10 (e.g., in the context of layers 10c and 10c', and possibly 10b), has multiple roles. For example, it has been found that hydrogen is advantageous for neutralization of oxygen from the growing Mo surface. This increases the mobility of the arriving Mo atoms and enhances quality of the film and overall electrode 10. The use of hydrogen gas during the Mo sputtering is also advantageous in that it increases the Mo based electrode 10's resistance to selenization during the downstream CIS fabrication process (when the semiconductor film(s) is/are being formed), and reduces stress asymmetry between the substrate travel and cross-coater direction observed in large-area coatings.

The use of a MoOx based buffer layer 10b between the rear glass substrate 11 and the layers 10c and 10c' is advantageous for the reasons explained above in connection with layer 10b. A significant purpose of a buffer layer 10b between the Mo (10c, 10c') and soda-lime-silica based glass 11 is to improve adhesion of the coating 10 to the glass 11, and to facilitate the laser scribe. This is done by the addition of oxygen and/or nitrogen during sputtering of the layer 10b, and possibly by increasing the sputtering pressure. These two measures promote the formation of a less crystalline film with better adhesion properties. Grain size of the buffer 10b is typically less than about 20 nm in certain example embodiments of this invention. The optional second stress-reducing layer 10c' is deposited under pressures intermediate between the high pressure of the main more conductive Mo film 10c and the low pressure of the buffer film 10b. Layer(s) 10c (and possibly 10c') are more metallic than layer 10b, because there is less oxygen in 10c (and possibly 10c') than in 10b in certain example embodiments of this invention.

Moreover, although oxygen is considered to have a negative effect on conducting properties of the film, slight oxidation between the cathodes was found to be beneficial for the coating since small amounts of oxygen can promote desirable sodium (Na) diffusion from the glass 11 through the Mo and toward or into the semiconductor during downstream CIS processing.

In certain example embodiments of this invention, referring to FIG. 10 for example, one or two sputtering targets may be used to sputter-deposit MoOx or Mo:NOx buffer layer 10b on (directly or indirectly) glass substrate 11. Metallic Mo or ceramic MoOx sputtering target(s) may be used in depositing buffer layer 10b. Likewise, one or two sputtering targets may be used to sputter-deposit optional Mo:N(H) intermediate layer 10c'. More hydrogen gas (and less oxygen gas) is used when sputter-depositing layer 10c' than in depositing layer 10b. Little or no hydrogen is used when sputter-depositing layer 10b in certain example embodiments. Moreover, one, two, three, four or more sputtering targets may be used to sputter-deposit Mo:N(H) substantially metallic Mo-based layer(s) 10c. Thus, layer 10c may be made up of one or more layers in example embodiments of this invention. Less (or no) oxygen gas is used when sputter-depositing layer 10c than in depositing layer 10b and/or 10c'. Metallic or substantially metallic Mo targets are used in sputter-depositing layer 10c and 10c' in certain example embodiments. Residual nitrogen, oxygen and hydrogen from these gases used during sputtering of electrode 10 may end up in the actual layers 10b, 10c' and 10c in the final electrode.

It has been found that further promotion of desirable sodium migration is achieved by using nitrogen during the Mo sputtering of rear electrode 10, in order to slightly amorphize the Mo-based electrode 10 without significantly affecting its electrical performance. In this respect, nitrogen gas may be used during the sputtering of layers 10c' and/or 10c, and possibly even layer 10b (this applies to any embodiment herein). As shown in FIG. 11, resistivity of nitrogen-doped Mo-based films was found to have a minimum at around about 1 wt. % of nitrogen in Ar gas used in the Mo sputtering. As also shown in FIG. 11, at about 0-2 wt. % of nitrogen (e.g., $N_2$) gas in the overall Ar gas during sputtering, the Mo film is essentially purely metallic and demonstrates a predominant <110> orientation. At >2 wt. % of nitrogen gas in the Ar gas, the presence of Mo2N with an <112> orientation can also be detected.

Besides promoting the sodium migration from soda-lime glass 11 to the CIS absorber 5, nitrogen used in sputtering and in film 10 is also advantageous in that it stabilizes the Fermi Level (FL) disturbed by a slight oxidation between the sputtering regions (see FIG. 12). The band diagram of the device with the energy position of corresponding bands in respect with the vacuum level is shown in FIG. 12. Work function of Mo is known to vary between 4.2 and 5.0 eV depending on the deposition conditions. For instance, Na implantation is used to lower WF of Mo in n-FETs for CMOS devices. On the other hand, oxidation of Mo at the interface with monoclinic zirconia is known to increase or decrease WF depending on the level of oxidation due to the rearrangement of the interface dipoles. The positioning of the FL is usually a trade-off between having a good ohmic contact properties and high electrical conductivity. Depending on the specifics of the CIS device fabrication, particularly, the composition of the absorber 5, adjustment of the FL of the bottom electrode 10 may be utilized. The use of nitrogen, therefore, is a convenient tool in tuning the Mo properties of the rear electrode 10 to a particular photovoltaic device.

In certain example embodiments of this invention, argon (Ar) or some other inert gas is the primary gas used in sputter-depositing the Mo-based layers of rear electrode 10. However, for the reasons explained above, in certain example embodiments, buffer layer 10b is sputter-deposited using a Mo or MoOx target(s) in an atmosphere including from about 0.001-10% (by weight) nitrogen gas, more preferably from about 0.1 to 3% nitrogen gas, even more preferably from about 0.5 to 1.5% nitrogen gas, and most preferably about 1% nitrogen gas, with the remainder of the gas in the sputtering atmosphere for this layer 10b being made up mostly or entirely of argon (or some other inert gas) and possibly a small amount of oxygen gas as discussed herein. In this respect, buffer layer 10b is based on Mo but includes from about 0.001-10% nitrogen, more preferably from about 0.1 to 3% nitrogen, even more preferably from about 0.5 to 1.5% nitrogen, and most preferably about 1% nitrogen, in certain example embodiments of this invention. Moreover, in certain example embodiments of this invention, buffer layer 10b is sputter-deposited using the Mo or MoOx target(s) in an atmosphere including (in addition to the argon and possibly the nitrogen gas discussed above) from about 0.001-10% (by weight) oxygen gas, more preferably from about 0.1 to 3% oxygen gas, even more preferably from about 0.5 to 1.5% oxygen gas, and most preferably about 1% oxygen gas, with the remainder of the gas in the sputtering atmosphere for this layer 10b being made up mostly or entirely of argon (or some other inert gas) and possibly a small amount of nitrogen gas as discussed above. In this respect, buffer layer 10b is based on Mo but includes from about 0.001-10% oxygen, more preferably from about 0.1 to 3% oxygen, even more preferably from about 0.5 to 1.5% oxygen, and most preferably about 1% oxygen, in certain example embodiments of this invention. The oxygen content of layer 10b may or may not be graded as discussed herein. Moreover, the Mo-based buffer layer 10b has an average grain size in diameter of from about 0.1 to 30 nm in certain example embodiments, more preferably from about 1-20 nm, and most preferably from about 5-20 nm.

In contrast, the Mo-based intermediate layer 10c' has a larger average grain size than does layer 10b, and in certain example embodiments the intermediate layer 10c' has an average grain size in diameter of from about 5 to 50 nm in certain example embodiments, more preferably from about 20-50 nm, and most preferably from about 25-45 nm.

For the reasons explained above, in certain example embodiments, Mo-based layer 10c' and Mo-based layer 10c (in any embodiment herein) may each be sputter-deposited using a Mo based target(s) (e.g., metallic Mo) in an atmosphere including from about 0.001-10% (by weight) nitrogen gas, more preferably from about 0.1 to 3% nitrogen gas, even more preferably from about 0.5 to 1.5% nitrogen gas, and most preferably about 1% nitrogen gas, with the remainder of the gas in the sputtering atmosphere(s) for these layer(s) 10c and 10c' being made up mostly or entirely of argon (or some other inert gas) and possibly some hydrogen gas as discussed herein. Moreover, Mo-based layer 10c' and Mo-based layer 10c (in any embodiment herein) may each be sputter-deposited using a Mo based target(s) (e.g., metallic Mo) in an atmosphere including from about 0.001-10% (by weight) hydrogen gas, more preferably from about 0.1 to 3% hydrogen gas, even more preferably from about 0.5 to 1.5% hydrogen gas, and most preferably about 1% hydrogen gas, with the remainder of the gas in the sputtering atmosphere(s) for these layer(s) 10c and 10c' being made up mostly or entirely of argon (or some other inert gas) and possibly some nitrogen gas as discussed herein. Small amounts of oxygen may also be present, as there can be slight intentional or unintentional oxidation between adjacent sputtering regions due to multi-cathode deposition. In certain example embodiments, Mo-based layer 10c' and Mo-based layer 10c (in any embodiment herein) may each be sputter-deposited in an atmosphere including from about 0.001-10% (by weight) hydrogen and nitrogen gas combined, more preferably from about 0.1 to 3% hydrogen and nitrogen gas combined, even more preferably from about 0.5 to 1.5% hydrogen and nitrogen gas combined, and most preferably about 1% hydrogen and nitrogen gas combined, with the remainder of the gas in the sputtering atmosphere(s) for these layer(s) 10c and 10c' being made up mostly or entirely of argon (or some other inert gas). These gas percentages are weight percentages. The technique of tuning the Work Function of the multi-layer Mo based electrode 10 to provided a good Fermi level may also be used to match or substantially match the CIS absorber.

While the Mo-based electrodes discussed herein (which may be of other metal in certain alternative embodiments) are used as rear electrodes of photovoltaic devices, this invention is not so limited. In particular, this invention may be used to form electrodes in such a manner for other applications as well.

while the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a rear electrode structure for a photovoltaic device, the method comprising:
    providing a glass substrate;
    depositing a conductive electrode comprising Mo (molybdenum) on the glass substrate; and
    wherein said depositing the conductive electrode comprising Mo (molybdenum) comprises sputtering at least one ceramic target comprising $MoO_x$ and at least one metallic target comprising Mo in depositing the conductive electrode, and wherein said depositing comprises sputter-depositing the conductive electrode comprising Mo so that the conductive electrode comprising Mo is more oxided at a location closer to the glass substrate than at a location further from the glass substrate.

2. The method of claim 1, further comprising providing the conductive electrode comprising Mo as a rear electrode in a photovoltaic device.

3. The method of claim 1, wherein for the at least one target comprising $MoO_x$, x is less than or equal to 0.1.

4. The method of claim 1, wherein for the at least one target comprising $MoO_x$, x is from 0.001 to 0.25.

5. The method of claim 1, wherein for the at least one target comprising $MoO_x$, x is from about 0.01 to 0.2.

6. The method of claim 1, wherein for the at least one target comprising $MoO_x$, x is from about 0.01 to 0.15.

7. The method of claim 1, wherein for the at least one target comprising $MoO_x$, x is from about 0.03 to 0.10.

8. The method of claim 1, further comprising providing a front glass substrate, an electrically conductive and substantially transparent front electrode; and an active semiconductor film located so that the front electrode is provided between at least the semiconductor film and the front glass substrate in the photovoltaic device and the conductive electrode comprising Mo is used as a rear electrode of the photovoltaic device.

9. The method of claim 1, further comprising providing a semiconductor film comprising CIGS and/or CIS on the glass substrate over at least the electrode.

10. The method of claim 1, further comprising proving the photovoltaic device with a front electrode that comprises, moving away from a front glass substrate of the device toward a semiconductor film of the device, at least a first substantially transparent conductive substantially metallic infrared (IR) reflecting layer comprising silver and/or gold, and a first transparent conductive oxide (TCO) film located between at least the IR reflecting layer and the semiconductor film.

11. The method of claim 1, further comprising providing a layer comprising Ti and/or Cr between the substrate and the conductive electrode comprising Mo.

12. The method of claim 1, wherein said depositing of the conductive electrode comprising Mo (molybdenum) comprises sputtering the ceramic target comprising $MoO_x$ and/or the metallic target comprising Mo in an atmosphere comprising an inert gas and from about 0.1 to 10% nitrogen gas.

13. The method of claim 1, wherein said depositing of the conductive electrode comprising Mo (molybdenum) comprises sputtering the ceramic target comprising $MoO_x$ and/or the metallic target comprising Mo in an atmosphere comprising an inert gas and from about 0.1 to 3% nitrogen gas.

14. The method of claim 1, wherein said depositing of the conductive electrode comprising Mo (molybdenum) comprises sputtering the ceramic target comprising $MoO_x$ and/or the metallic target comprising Mo in an atmosphere comprising an inert gas and from about 0.1 to 10% hydrogen gas.

15. The method of claim 1, wherein said depositing of the conductive electrode comprising Mo (molybdenum) comprises sputtering the ceramic target comprising $MoO_x$ and/or the metallic target comprising Mo in an atmosphere comprising an inert gas and from about 0.1 to 3% hydrogen gas.

16. A method of making a rear electrode structure for a photovoltaic device, the method comprising:
    providing a glass substrate;
    depositing a conductive electrode comprising Mo (molybdenum) on the glass substrate;
    wherein said depositing the conductive electrode comprising Mo (molybdenum) comprises sputtering at least one ceramic target comprising $MoO_x$ and at least one metallic target comprising Mo in depositing the conductive electrode, and
    ion beam treating a major surface of the conductive electrode in order to texture, or additionally texture, the major surface of the electrode thereby providing a textured electrode having a textured reflective surface; and
    providing the textured electrode, supported by at least the glass substrate, as a rear electrode in a photovoltaic device.

17. The method of claim 16, wherein said depositing comprises sputter-depositing the conductive electrode comprising Mo so that the conductive electrode comprising Mo is more oxided at a location closer to the substrate than at a location further from the substrate.

18. The method of claim 16, wherein said ion beam treating is performed so that following the ion beam treating the textured reflective surface of the electrode comprises peaks, valleys and inclined portions connecting the peaks and valleys, and wherein major surfaces of at least some of the inclined portions form an angle α of at least about 25 degrees with the plane and/or rear surface of the glass substrate.

19. The method of claim 16, wherein viewed cross sectionally the textured reflective surface of the electrode comprises peaks, valleys and inclined portions connecting the peaks and valleys, and wherein major surfaces of at least some of the inclined portions form an angle α of from about 25-35 degrees with the plane and/or rear surface of the glass substrate.

20. The method of claim 16, wherein a pattern of the textured reflective surface has a periodicity of from about 20 to 200 nm.

21. A method of making a rear electrode structure for a photovoltaic device, the method comprising:
  providing a substrate;
  depositing a conductive electrode comprising a metal (M) on the substrate; and
  wherein said depositing the conductive electrode comprises sputtering at least one ceramic target comprising $MO_x$ and at least one metallic target comprising M in depositing the conductive electrode, wherein said depositing comprises sputter-depositing the conductive electrode so that the conductive electrode is more oxided at a location closer to the substrate than at a location further from the substrate.

22. The method of claim 21, further comprising using the conductive electrode as a rear electrode in a photovoltaic device.

23. The method of claim 21, where M is Mo.

24. The method of claim 21, wherein for the at least one target comprising $MO_x$, x is from 0.001 to 0.25.

25. The method of claim 21, wherein for the at least one target comprising $MO_x$, x is from about 0.01 to 0.15.

26. The method of claim 21, further comprising providing a front substrate, an electrically conductive and substantially transparent front electrode; and an active semiconductor film located so that the front electrode is provided between at least the semiconductor film and the front substrate in the photovoltaic device and the conductive electrode comprising M is used as a rear electrode of the photovoltaic device.

27. The method of claim 21, wherein said depositing of the conductive electrode comprises sputtering the ceramic target and/or the metallic target in an atmosphere comprising an inert gas and from about 0.1 to 10% nitrogen gas and/or 0.1 to 10% hydrogen gas.

28. A method of making a photovoltaic device, the method comprising:
  providing a glass substrate;
  depositing a conductive electrode comprising Mo on the glass substrate;
  wherein said depositing the conductive electrode comprising Mo comprises sputtering at least one ceramic target comprising $MoO_x$ so as to form a layer and/or portion of a layer comprising $MoO_x$ over the glass substrate, and sputtering at least one metallic target comprising Mo so as to form a metallic layer and/or portion of a layer comprising Mo over the layer and/or the portion of the layer comprising $MoO_x$, in depositing the conductive electrode;
  wherein the electrode comprising Mo, supported by at least the glass substrate, is a rear electrode in a photovoltaic device.

29. A method of making a rear electrode structure for a photovoltaic device, the method comprising:
  providing a glass substrate;
  depositing a conductive electrode comprising Mo (molybdenum) on the glass substrate; and
  wherein said depositing the conductive electrode comprising Mo (molybdenum) comprises sputtering at least one ceramic target comprising $MoO_x$ and at least one metallic target comprising Mo in depositing the conductive electrode, and wherein said depositing further comprises sputter-depositing the conductive electrode comprising Mo so that the conductive electrode comprising Mo is more oxided at a location closer to the substrate than at a location further from the substrate.

30. A method of making a rear electrode structure for a photovoltaic device, the method comprising:
  providing a glass substrate;
  depositing a conductive electrode comprising Mo (molybdenum) on the glass substrate; and
  wherein said depositing the conductive electrode comprising Mo (molybdenum) comprises sputtering at least one ceramic target comprising $MoO_x$ and at least one metallic target comprising Mo in depositing the conductive electrode; and
  ion beam treating a major surface of the conductive electrode in order to texture and/or additionally texture the major surface of the electrode thereby providing a textured electrode having a textured reflective surface, wherein the textured electrode, supported by at least the glass substrate, is a rear electrode in a photovoltaic device.

* * * * *